United States Patent
Friedman et al.

(10) Patent No.: US 11,843,460 B2
(45) Date of Patent: Dec. 12, 2023

(54) BLUETOOTH RECEIVER, ELECTRONIC DEVICE AND METHOD FOR A BLUETOOTH RECEIVER

(71) Applicant: Intel Corporation, Santa Clara, CA (US)

(72) Inventors: Avishay Friedman, Petach Tikva (IL); Yarden Regev, Tel Aviv (IL); Jinyong Lee, Fremont, CA (US); Assaf Gurevitz, Ramat Hasharon (IL)

(73) Assignee: Intel Corporation, Santa Clara, CA (US)

( * ) Notice: Subject to any disclaimer, the term of this patent is extended or adjusted under 35 U.S.C. 154(b) by 87 days.

(21) Appl. No.: 17/455,979

(22) Filed: Nov. 22, 2021

(65) Prior Publication Data
US 2022/0200726 A1 Jun. 23, 2022

(30) Foreign Application Priority Data
Dec. 23, 2020 (EP) .................................. 20216856

(51) Int. Cl.
*H04L 1/00* (2006.01)
*H04W 4/08* (2009.01)

(52) U.S. Cl.
CPC ............. *H04L 1/0045* (2013.01); *H04W 4/08* (2013.01)

(58) Field of Classification Search
None
See application file for complete search history.

(56) References Cited

U.S. PATENT DOCUMENTS

| | | | | |
|---|---|---|---|---|
| 6,577,630 B1* | 6/2003 | Markwalter | .......... | H04L 12/462 370/445 |
| 6,987,770 B1* | 1/2006 | Yonge, III | ............ | H04L 1/0083 370/445 |
| 7,469,297 B1* | 12/2008 | Kostoff, II | ............ | H04L 69/324 709/236 |
| 10,256,944 B1* | 4/2019 | Sun | ........................ | H04L 1/0061 |
| 2011/0209029 A1 | 8/2011 | Zopf | | |

(Continued)

*Primary Examiner* — Mujtaba M Chaudry
(74) *Attorney, Agent, or Firm* — SPL Patentanwälte PartG mbB; Kieran O'Leary

(57) ABSTRACT

A Bluetooth receiver is provided. The Bluetooth receiver comprises interface circuitry configured to receive a receive packet. Further, the Bluetooth receiver comprises physical layer processing circuitry configured to demodulate the receive packet into a bit stream representing a sequence of data symbols. Further, the physical layer configured to determine a number of bits in the bit stream having a highest likelihood of being erroneous as weak-bits and determine locations of the identified weak-bits in the bit stream. The Bluetooth receiver further comprises medium access control layer processing circuitry configured to receive the bit stream and information about the determined locations of the identified weak-bits from the physical layer processing circuitry. Further, the medium access control layer is configured to flip one of the weak-bits and a sequential bit in the bit stream in order to generate a modified bit stream, run a respective cyclic redundancy check on the bit stream and the modified bit stream and compare results of the cyclic redundancy checks on the bit stream and on the modified bit stream.

20 Claims, 8 Drawing Sheets

(56) References Cited

U.S. PATENT DOCUMENTS

| | | | |
|---|---|---|---|
| 2013/0191706 A1* | 7/2013 | Zopf | H04L 1/005 |
| | | | 714/776 |
| 2015/0236717 A1 | 8/2015 | El-Khamy et al. | |
| 2017/0331670 A1* | 11/2017 | Parkvall | H04W 52/028 |
| 2021/0029513 A1* | 1/2021 | Rico Alvarino | H04W 72/121 |

* cited by examiner

BLUETOOTH RECEIVER, ELECTRONIC DEVICE AND METHOD FOR A BLUETOOTH RECEIVER

CROSS-REFERENCE TO RELATED APPLICATION

This application claims priority to European Application 20216856.3, filed on Dec. 23, 2020. The content of this earlier filed application is incorporated by reference herein in its entirety.

FIELD

The present disclosure relates to packet management for Bluetooth receivers. In particular, examples relate to Bluetooth receivers, an electronic device and methods for a Bluetooth receiver.

BACKGROUND

Conceptual models for Bluetooth (BT) receiver implementation separate communication in the BT receiver into different layers such as physical layer (PHY), medium access control (MAC) etc. The PHY is responsible for proper decoding of the received bits while the MAC is responsible for link level management. This separation may lead to a decrease in performance at the BT receiver. However, separation of the PHY and the MAC may be desired because they may have different stacks and run on different system-on-chips (SOCs). Thus, a BT receiver with improved performance may be desired.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further, examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of the group A and B". The same applies for combinations of more than two elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
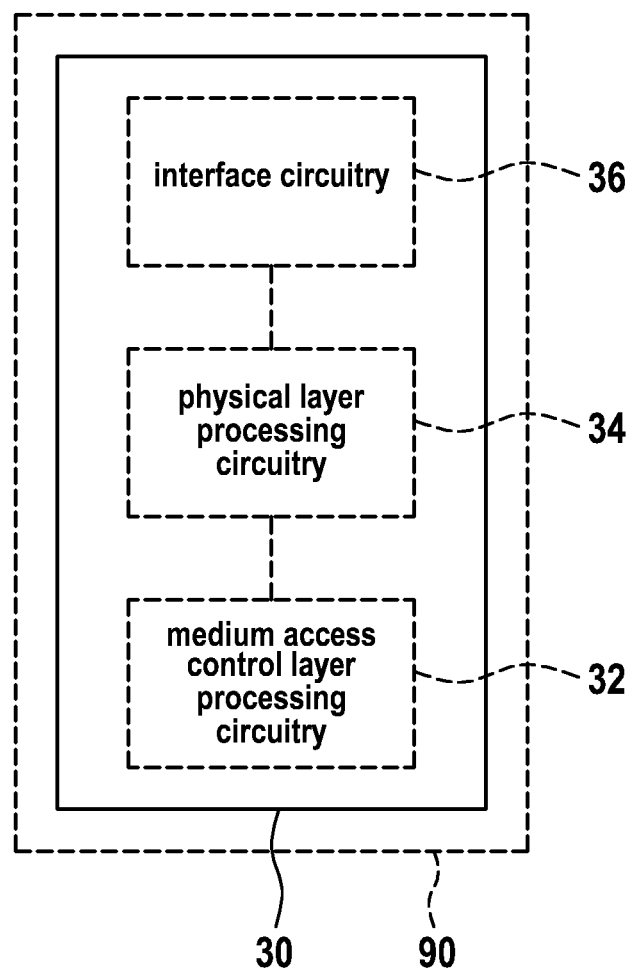
FIG. 1 shows a block schema of an example of a BT receiver.

FIG. 1 shows a block schema of an example of a BT receiver 30. The BT receiver 30 comprise interface circuitry 36 configured to receive a receive packet. Further, the BT receiver 30 may comprise physical layer processing circuitry 34 (PHYPC) configured to demodulate the receive packet into a bit stream representing a sequence of data symbols. Further, the PHYPC 34 is configured to determine a number of bits in the bit stream having a highest likelihood of being erroneous as weak-bits. The PHYPC 34 is additionally configured to determine locations of the identified weak-bits in the bit stream. The BT receiver 30 further comprises medium access control layer processing circuitry 32 (MACPC) configured to receive the bit stream and information about the determined locations of the identified weak-bits from the PHYPC 34. Further, the MACPC 32 is configured to flip one of the weak-bits and a sequential bit in the bit stream in order to generate a modified bit stream. Further, the MACPC 32 is configured to run a respective cyclic redundancy check on the bit stream and the modified bit stream. The MACPC 32 is additionally configured to compare results of the cyclic redundancy checks on the bit stream and on the modified bit stream.

The information about the location of weak-bits (e.g. as soft-metrics) in the bit stream is conventionally restricted to the PHYPC 34 due to the separation of the data processing into the different layers. By sharing the information about location of weak-bits with the MACPC 32, the separation between the PHYPC 34 and the MACPC 32 may be partially broken. As a consequence, the MACPC 32 has the information about weak-bits (soft-metric) and their location in the bit stream. Thus, the MACPC 32 may achieve substantial performance gain which may be translated into an increased receive range for the BT receiver 30 or an improved processing of the receive packet at the BT receiver 30. This may increase a signal to noise ratio (SNR) of the BT receiver 30 and/or a false-positive detection rate. By allowing the MACPC 32 to flip weak-bits based on their location, the BT receiver may achieve a receiver performance that goes beyond the theoretic limit of "pure" PHY implementation (i.e. a strict separation of PHY and MAC).

During the cyclic redundancy check (CRC) the MACPC 32 may compare a calculated CRC bit stream with a received CRC bit stream (e.g. derived from the bit stream demodulated from the receive packet) and, if both bit streams are the same the CRC is passed, indicating a successful transmission of the receive packet. For example, if the CRC is failed by the CRC bit stream derived from the bit stream, the receive packet is rejected, because the CRC provides no information about an erroneous bit in the bit stream. Thus, by generating a modified bit stream the CRC may be performed for several bit streams, which may increase a likelihood to pass the CRC. Thus, a rejection rate of the receive packet may be decreased, which may increase the SNR. Further, unnecessary retransmission of the receive packet may be omitted.

On the other hand, the CRC may be passed though the receive packet that was not successfully transmitted, e.g. the receive may be an erroneous packet. The BT standard has a weak CRC polynomial (e.g. 16 bits) and the false-positive detection rate is a known drawback of the BT standard. By running the CRC multiple times with different bit streams, two of these different bit streams, e.g. the bit stream and the modified bit stream, may pass the CRC, indicating that at least on of these bit streams may be erroneous. Thus, a false-positive check may be performed to decrease an acceptance rate of the erroneous packet, which may increase the false-positive detection rate of the BT receiver 30.

For example, the MACPC 32 may flip one of the weak-bits in the bit stream (and a respective sequential bit) based on the locations of the weak-bits and may generate a modified bit stream, that may be utilized by the MACPC 32 for further processing, e.g. for run a respective CRC. By generating the modified bit stream for further processing the rejection rate of the receive packet (e.g. by omitting a retransmission) and/or the acceptance rate of the erroneous packet may be decreased (e.g. by performing the false-positive check).

Further, by transmitting/receiving only the locations of the weak-bits and not the location of all bits of the bit stream a data traffic between the PHYPC 34 and the MACPC 32 may be reduced.

The interface circuitry 26 may receive the receive packet, which may be transmitted from a BT transmitter. Thus, the receive packet may be a modulated packet according to the BT standard, e.g. modulated by Gaussian Frequency Shift Keying (GFSK) for basic rate (BR) or low energy (LE) or by Differential Phase Shift Keying (DPSK) for enhanced data rate (EDR).

The PHYPC 34 may be configured to demodulate the (modulated) receive packet by soft decision demodulation into the bit stream. Further, the PHYPC 34 may be configured to determine soft information indicating the respective likelihood of being erroneous for the bits in the bit stream and identify the number of weak-bits based on the soft information. For example, the PHYPC 34 may utilize different programs for the different BT standards to generate soft-metrics for each bit by soft decision demodulation of the receive packet. The soft-metric may indicate a likelihood of the bit to be erroneous. For example, the soft decision demodulation may assign a value to every bit. Bits assigned the value 0 or 1 may have the lowest likelihood for being erroneous and bits assigned the value 0.5 may have the highest likelihood for being erroneous. The highest likelihood for being erroneous to determine weak-bits may depend on the value assigned by the soft decision demodulation. For example, a number of predefined bits of the receive packet (e.g. at most 0.05%, or at most 0.1%, or at most 0.2%) closest to a predefined soft-metric value (e.g. 0.5) may be defined as erroneous. Alternatively, all bits in a range around the value for the highest likelihood to be erroneous may be defined as erroneous, e.g. all bits with an assigned value between 0.45-0.55.

The PHYPC 34 may be further configured to sort the weak-bits in the bit stream in an order of the likelihood of being erroneous. The MACPC 32 may be further configured to flip one of the weak-bits and the sequential bit in the bit stream based on the order of the likelihood of being erroneous. By sorting the weak-bits the MACPC 32 may firstly flip a weakest bit (e.g. the bit of the number of bits with the highest likelihood for being erroneous) of the bit stream. Thus, the likelihood for flipping an erroneous bit and generating the modified bit stream that may pass the CRC may be increased.

Besides flipping one of the weak-bits, flipping the sequential bit to generate the modified bit stream may further decrease the rejection rate of the receive packet and/or an acceptance rate of the erroneous packet. Due to the GFSK and the DPSK inherent properties, a bit error may propagate also to the sequential bit, hence most of the bit errors may appear in two sequential bits that may be identified by a (small) soft-metric on one of the weak-bits. Thus, by identifying the weak-bits and by flipping one of these weak-bits and the sequential bit, the performance of the BT receiver 30 may be further increased. It may be needed to apply a constraint that if one of the weak-bits is flipped the sequential bit is also flipped. This may be done by defining $k_e$ as a weak-bit index of the error bit and by defining the sequential bit $k_{ep}$ with the propagated error $k_{ep}=k_{e+1}$. For example, $k_e$ and $k_{ep}$ may be only flipped as bit pair.

Each demodulated data symbol in the sequence of demodulated data symbols may be represented by at least two bits in the bit stream. Further, the one of the weak-bits may belong to a first demodulated data symbol in the sequence of demodulated data symbols. Further, the sequential bit may belong to a second demodulated data symbol in the sequence of demodulated data symbols that immediately follows the first demodulated data symbol in the sequence of demodulated data symbols. For example, the bit error caused by the DPSK inherent properties may propagate to the sequential symbol and so not necessarily to the next bit, because in EDR each symbol comprises two or three bits. Thus, by flipping a sequential bit in a sequential symbol the performance of the BT receiver 30 may be increased. For this, the most probable erroneous bit $k_{ep}$ in the next symbol may have to be determined.

The determination of the most probable erroneous bit $k_{ep}$ in the next symbol for EDR with two bits per symbol (EDR2) may be as follows. An aim may be to calculate the weak-bit index $k_e$ given a relevant symbol index n of a relevant symbol $S_n$ (e.g. the relevant symbol may be determined by one of the weak-bits) and the phase error sign $e_\phi$. The PHYPC 34 may be further configured to determine a bit among the bits belonging to the second demodulated data symbol with the highest likelihood for being erroneous based on a least significant bit and a most significant bit among the bits belonging to the second demodulated data symbol. A location bit L may be defined in dependence of the least significant bit (LSB) and the most significant bit (MSB) to $$L = \begin{cases} 1 & LSB \\ 0 & MSB \end{cases}$$

and the weak-bit index to $$k_e = 2n - \overline{L} = \begin{cases} 2n & LSB \\ 2n-1 & MSB \end{cases}.$$

A rotation direction may be determined by the phase error sign and the signum function sgn $$\text{sgn} = \begin{cases} 0 & e_\phi^n > 0 \\ d & d_\phi^n = 0 \\ 1 & e_\phi^n < 0 \end{cases}.$$

Note that the case $e_\phi^n=0$ may be not interesting because in that case the symbol can not considered to be weak. Hence, this bit value may be neglected.

Figure 6A:
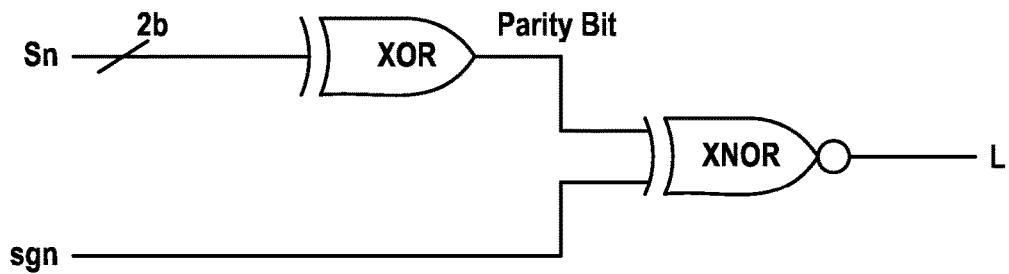
FIGS. 6a to 6d shows different logic circuits for determining the sequential bit.

The PHYPC 34 may be further configured to apply a bitwise exclusive or operation (XOR) on bits belonging to the first demodulated data symbol to determine a bit with the highest likelihood of being erroneous in the sequential symbol. The XOR may be applied on the two bits of the relevant symbol $S_n$. After applying the XOR on the first (relevant) demodulated data symbol $S_n$ a parity bit may be added to a result and than a bitwise exclusive not or operation (XNOR) may be applied on the result of the XOR and the signum function leading to the location L (see also FIG. 6a).

The next aim may be to calculate the error propagation given the weak-bit index $k_e=1, 2, \ldots$ packetLength, the relevant symbol $S_n$ and the next symbol $S_{n+1}$.

Again define the location in the symbol:

$$L = \begin{cases} 1 & LSB \\ 0 & MSB \end{cases},$$

where $k_e$ is the bit index in the packet.

| L | $\hat{s}_n$ (Current symbol) | $\hat{s}_{n+1}$ (next symbol) |
|---|---|---|
| 1 | packet[$k_e - 1$: $k_e$] | packet[$k_e + 1$: $k_e + 2$] |
| 0 | packet[$k_e$: $k_e + 1$] | packet[$k_e + 2$: $k_e + 3$] |

As explained above a next symbol bit error location $L^{next}$ may by given by $$\begin{cases} L^{next} = \overline{L} & \text{if the symbols are from the same group} \\ L^{next} = L & \text{else} \end{cases}.$$

Hence, $L^{next}$ (1 for LSB, 0 for MSB) may be determined by applying the XOR. The XOR may be applied on the four bits of the relevant symbol $S_n$ and the next symbol $S_{n+1}$. After applying the XOR on the first (relevant) demodulated data symbol $S_n$ and the second (next) demodulated data symbol $S_{n+1}$ a parity bit may be added to a result and than the XNOR may be applied on the result of the XOR and the determined L leading to the location of the next symbol bit error $L^{next}$ (see also FIG. 6b).

Finally the next error location $k_{ep}$ may be determined by

|  | L = 1 | L = 0 |
|---|---|---|
| $L^{next} = 1$ | $k_{ep} = k_e + 2$ | $k_{ep} = k_e + 1$ |
| $L^{next} = 0$ | $k_{ep} = k_e + 3$ | $k_{ep} = k_e + 2$ |

Equivalently the next error location $k_{ep}$ may be written as follows $$k_{ep} = k_e + d,$$

with $$d = 2 + \overline{L^{next}} - \overline{L}.$$

The determination of the most probable erroneous bit $k_{ep}$ in the next symbol for EDR with three bits per symbol (EDR3) may be as follows.

The bit location $\{L_1, L_2\}$ may be given by

|  | $L_1$ | $L_2$ | $\hat{s}_n$ (Current symbol) |
|---|---|---|---|
| MSB: $k_e \% 3 = 1$ | 0 | 0 | packet[$k_e$: $k_e + 2$] |
| MID: $k_e \% 3 = 2$ | 0 | 1 | packet[$k_e - 1$: $k_e + 1$] |
| LSB: $k_e \% 3 = 0$ | 1 | d | packet[$k_e - 2$: $k_e$] | with d meaning neglect this value and % is for modulo. This may be written equivalently as follows $$k_e = \begin{cases} 3n & \text{if } L_1 = 1 & (LSB) \\ 3n - 1 & \text{if } L_1 = 0, L_2 = 1 & (MID) \\ 3n - 2 & \text{if } L_1 = 0, L_2 = 1 & (MSB) \end{cases}.$$

The logic for $L_1$ may be the same as the logic for L in EDR2.

$L_2 = s_n[3]$ may be chosen as the last bit of the symbol. Hence, the error bit location may be defined by applying the XOR. The XOR may be applied on the three bits of the relevant symbol $S_n$. $L_2$, the location of the last bit, may be determined without applying the XOR. After applying the XOR on the first (relevant) demodulated data symbol $S_n$ a parity bit may be added to a result and than the XNOR may be applied on the result of the XOR and the signum function leading to the location $L_1$ (see also FIG. 6c). If the symbols belong to different groups, they may be determined by the added parity bit.

By definition, the soft-metric in EDR3 is always smaller for a ±45° error, namely all of the weak-bit indices flips or changes the symbol phase by ±45°.

An aim may be to find $L_1^{next}$, $L_2^{next}$. As in EDR 2, if the two symbols are in the same group, one of them may have a flip in the LSB, else either both of them or none of them may have the LSB. This binary event may be represented by $L_1$, $L_1^{next}$.

The way to find $L_1^{next}$ may be similar to the way to find $L^{next}$ in EDR2:

$$\begin{cases} L_1^{next} = \overline{L_1} & \text{if the symbols are from the same group} \\ L_1^{next} = L_1 & \text{else} \end{cases}$$

The value of $L_2^{next}$ may be determined by the second bit that may be flipped. From FIG. 6a, it follows that the value of $L_2^{next}$ may be determined according to the next symbol LSB. Hence, $L_1^{next}$ and $L_2^{next}$ ($L_2^{next}=\hat{s}_{n+1}[3]$) may be determined by applying the XOR. The XOR may be applied on the six bits of the relevant symbol $S_n$ and the next symbol $S_{n+1}$. $L_2^{next}$, the location of the last bit in the next symbol $s_n[3]$, may be determined without applying the XOR. After applying the XOR on the first (relevant) demodulated data symbol $S_n$ and the second (next) demodulated data symbol $S_{n+1}$ a parity bit may be added to a result and than the XNOR may be applied on the result of the XOR and the determined $L_1$ leading to the location of the next symbol bit error $L_1^{next}$ (see also FIG. 6d).

Finally the next error location $k_{ep}$ may be determined as follows

|  | $L_1 = 0$<br>$L_2 = 0$ | $L_1 = 0$<br>$L_2 = 1$ | $L_1 = 1$<br>$L_2 = d$ |
|---|---|---|---|
| $L_1^{next} = 0$<br>$L_2^{next} = 0$ | $k_{ep} = k_e + 3$ | $k_{ep} = k_e + 2$ | $k_{ep} = k_e + 1$ |
| $L_1^{next} = 0$<br>$L_2^{next} = 1$ | $k_{ep} = k_e + 4$ | $k_{ep} = k_e + 3$ | $k_{ep} = k_e + 2$ |
| $L_1^{next} = 1$<br>$L_2^{next} = d$ | $k_{ep} = k_e + 5$ | $k_{ep} = k_e + 4$ | $k_{ep} = k_e + 3$ |

Note that the offset may be $1 \le d = k_{ep} - k_e \le 5$, hence it may be represented by 3b.

Flipping of one of the weak-bits and the sequential bit may be performed until a stop condition may be fulfilled. For example, one stop condition may be the bit stream and/or the modified passed the CRC. If the bit stream fails its cyclic redundancy check and the modified bit stream passes its cyclic redundancy check, the MACPC 32 may be further configured to further process only the modified bit stream among the bit stream and the modified bit stream. Thus, by generating the modified bit stream and using only this for further processing the rejection rate may be decreased. For example, the receive packet may be rejected if the bit stream fails the CRC, but if the modified bit stream passes the CRC the receive packet may be used for further process based on the modified bit stream. Thus, a performance of the BT receiver 30 may be increased by utilizing the modified bit stream leading to a decrease of the rejection rate of the receive packet. This may increase the SNR and may decrease the data transfer.

If the bit stream and the modified bit stream fails its cyclic redundancy check, the MACPC 32 may be further configured to perform the following iterative processing in i-th iterations with 1<i. i may be a number of weak-bit permutations with one flip of a weak-bit at a time. The MACPC 32 may be further configured to flip one weak-bit and a sequential bit in a bit stream of the (i−1)-th iteration in order to generate a bit stream of the i-th iteration with an unused permutation of weak-bits. The modified bit stream may be used as the bit stream of the (i−1)-th iteration for the first iteration. The MACPC 32 may be further configured to run the cyclic redundancy check on the bit stream of the i-th iteration; and determine whether one of the following stop conditions may be fulfilled: a) the bit stream of the i-th iteration passes the cyclic redundancy check or b) all permutations of weak-bit are used to generate a bit stream of the (i)-th iteration. The MACPC 32 may be further configured to stop the iterative processing if one of the stop conditions is fulfilled.

For example, a bit stream may comprise six weak-bits, leading to a total number of possible modified bit streams of $2^6-1$ (−1 because of the bit stream, no weak-bits have to be flipped; i=63). Note, that the number of flipped bits may be 12 not 6, since the sequential bit may be also flipped. The CRC may be performed for each modified bit stream generated by flipping one of the weak-bits and the sequential bit until the CRC may be passed.

For example, the weak-bits may be flipped for the iterative processing in the order of the likelihood of being erroneous. Thus, e.g. stop condition a) may be reached with fewer permutations of weak-bits. This may lead to a reduced time consumption and/or energy consumption to reach the stop condition a).

The MACPC 32 may be further configured to further process only the modified bit stream of the i-th iteration among the bit stream and the modified bit streams if stop condition a) is fulfilled. For example, the CRC may be performed until one modified bit stream may be found, which may pass the CRC. Thus, the rejection rate of the receive packet may be decreased, which may increase the SNR and may decrease the data transfer. This approach may be utilized for operation modes of the BT receiver 30, which may be less sensitive for a false bit stream, e.g. if an effect of a false bit stream is neglectable. For example, if a BT transmission comprises a plurality of small (independent) receive packets, e.g. for communication with a BT headphone, a false bit stream may lead only to a short interruption in the communication, which may be neglectable. Thus, e.g. for BT headphones this approach may be utilized.

Alternatively, the CRC may be performed for all possible ways to fix an erroneous bit in the bit stream and when all CRC fail the receive packet may be rejected. The MACPC 32 may be further configured to reject the bit stream if stop condition b) is fulfilled.

If the bit stream and the modified bit stream pass the respective cyclic redundancy check, the MACPC 32 may be further configured to reject the bit stream. If the CRC passes for two times, at least one of both bit streams may be erroneous. The CRC may be the only possibility for the MACPC 32 to determine an erroneous bit stream. If for example, the erroneous bit stream (e.g. the bit stream) and one non-erroneous bit stream (the modified bit stream) pass its CRC the MACPC 32 can not differ between the erroneous bit stream and the non-erroneous bit stream. Thus, the receive packet may be rejected, because the non-erroneous bit stream can not be determined by the MACPC 32. This may prevent the BT receiver 30 to use the erroneous bit stream, which may increase the false-positive detection rate.

If the bit stream passes its cyclic redundancy check and the modified bit stream fails its cyclic redundancy check, the MACPC 32 may be further configured to perform the following iterative processing in i-th iterations with 1<i. i may be a number of weak-bit permutations with one flip of a weak-bit at a time. The MACPC 32 may be further configured to flip one weak-bit and a sequential bit in a bit stream of the (i−1)-th iteration in order to generate a bit stream of the i-th iteration with an unused permutation of weak-bits. The modified bit stream may be used as the bit stream of the (i−1)-th iteration for the first iteration. The MACPC 32 may be further configured to run the cyclic redundancy check on the bit stream of the i-th iteration; and determine whether one of the following stop conditions may be fulfilled: a) the bit stream of the i-th iteration passes the cyclic redundancy check or b) all permutations of weak-bit are used to generate a bit stream of the (i)-th iteration. The MACPC 32 may be further configured to stop the iterative processing if one of the stop conditions is fulfilled.

Even if the bit stream has passed its CRC, the bit stream may have an erroneous bit in the bit stream. Thus, the CRC iteration processing may be performed even if the CRC the bit stream is passed by the bit-stream, in order to detect false alarm events, e.g. to perform the false-positive check. If one of the modified bit streams pass its CRC the bit stream may be declared as false-positive. The MACPC 32 may be further configured to reject the bit stream if stop condition a) is fulfilled. For example, the CRC may be performed until one modified bit stream may be found, which pass the CRC. For this, two bit streams, the bit stream and the modified bit stream of the i-th iteration have passed the CRC, indicating an erroneous bit stream. Thus, the receive packet may be rejected, which may improve the false-positive detection rate. This false-positive check may be combined with some threshold over the mean of the error metrics or the number of weak-bits. The false-positive check may be utilized for operation modes of the BT receiver 30 where a high precision of the BT transmission may be desired. For example, for BT protocols that may be very sensitive, because the receive packet for BT protocols may comprise hundreds of sub-packets and an error in one sub-packet may lead to an error in the receive packet. For this operation modes, e.g. receiving BT protocols, the false-positive check may be utilized, which may increase the performance of the BT receiver 30.

The MACPC 32 may be further configured to further process only the modified bit stream of the i-th iteration among the bit stream and the modified bit streams if stop condition b) is fulfilled. For this, only the bit stream has passed the CRC. Thus, a likelihood that the receive packet was transmitted correctly may be improved, which may improve the false-positive detection rate.

The MACPC 32 may be further configured to generate a lookup table (LUT) with syndromes for the bit stream in order to syndrome decode the bit stream. Further, the MACPC 32 may be configured to run the cyclic redundancy check on the bit stream by running the cyclic redundancy check on the syndromes.

The MACPC 32 may be further configured to generate syndromes for flipped weak-bits. Further, the MACPC 32 may be further configured to modify the LUT with the syndromes of flipped weak-bits in order to generate a modified LUT for each weak-bit permutation with one flip of a weak-bit at a time of the bit stream. The MACPC 32 may be further configured to run the cyclic redundancy check with all modified LUTs. The cyclic redundancy check may be passed if it is passed for only one of the modified LUTs.

Using the linearity of the CRC a LUT may be generated by the XOR on the bit stream syndrome to the relevant weak-bits syndromes according to the weak-bit indices and the error propagation.

The $i^{th}$ row $r_i$ in the LUT may contain the syndrome of a vector as the same length of the receive packet and may contains single '1' in index i:

$$v^i_{[k]} = \begin{cases} 1 & k=i \\ 0 & \text{else} \end{cases} \quad r_i = CRC(v^i).$$

To preserve linearity, the LUT may be built with zero initial CRC state. To perform the CRC text on the bit stream demodulated from the receive packet flipped at index k the original syndrome row $N_{max}$–N+k may be added. Where $N_{max}$ is the maximal packet length (also the number of rows in the CRC table) and N is the packet length.

Using syndrome LUT is shown exemplary for GFSK. The weak-bit indices of the packet according to the soft-metric may be {3,19,106,432,433,519}. By considering the error propagation in GFSK (e.g. error propagation to the sequential bit), the relevant indices to flip may be {3, 4, 19, 20, 106, 107, 432, 433, 433, 434, 519, 520} (underlined bits are sequential bits).

6 syndromes according to the error propagation may be computed as follows ($\oplus$ is the dyadic product)

$$p_1 = r_{N_{max}-N+3} \oplus r_{N_{max}-N+4} \cdots p_6 = r_{N_{max}-N+519} \oplus r_{N_{max}-N+\cup}.$$

In a first cycle $s_1$ may be added to the original syndrome. In a second cycle $s_2$ may be added to the original syndrome. In a third cycle $s_1 \oplus s_2$ may be added to the original syndrome, and so on. All in all this may done to go over the power set sized $2^6-1$.

For 2 consecutive weak indices the syndrome may be generated in the same way ($p_4 = r_{432} \oplus r_{433}$, $p_5 = r_{433} \oplus r_{434}$). In that way there may follow 4 options:

| s | 432 | 433 | 434 |
|---|---|---|---|
| None enabled | | | |
| $p_4$ enabled | x | x | |
| $p_5$ enabled | | x | x |
| Both enabled | x | | x |

If the CRC is passed in exactly one of these combinations, the receive packet may be assumed to have no error and the relevant bits may be flipped. If one of the weak-bits is located in the original syndrome at the end of the receive packet, the new syndrome may be compared (flipped in the relevant indices) in the relevant cycles.

If the CRC may fail over one transmission (e.g. the receive packet) and also over the (sequential) retransmission (e.g. the retransmission may comprise the same receive packet as the transmission), a CRC combining method may be used. The interface circuitry 26 may be further configured to receive a retransmission packet. The PHYPC 34 may be further configured to demodulate the retransmission packet into a second bit stream. Further, the PHYPC 34 may be configured to apply a bitwise exclusive or operation on the bit stream and the second bit stream in order to generate a third bit stream and determine the number of weak-bits based on the third bit stream.

The retransmission packet may be a packet that comprises the same information as the receive packet. The retransmission packet may be requested by the BT receiver 30, e.g. because the receive packet may be rejected, because it may be an erroneous packet. Thus, the retransmission packet may be utilized to replace the erroneous packet. The retransmission packet may be demodulated into the second bit stream. For example, the second bit stream may be utilized to generate the third bit stream by XOR on the second bit stream and the third bit stream. The PHYPC 34 may be configured to determine every bit of value "1" in the third bit stream as weak-bit. For example, the bit stream and the second bit stream may be demodulated by a hard-decision demodulator. Thus, a number a weak-bits may be decreased for the third bit stream in comparison to the bit stream or the second bit stream. For example, only the erroneous bits of the receive packet may be determined as weak-bits, because only these bits may differ from a corresponding bit in the retransmission packet. Thus, the data transfer between PHYPC 34 and MACPC 32 may be decreased by the CRC combining method.

For example, on the two received packets (receive packet and retransmission packet) the XOR may be applied to find differences between the two packets. Indices of bits in the bit stream and the second bit stream that has differences between the two packets may be considered to have weak-bits. The location of these weak-bits may be transmitted to the MACPC 32 and the MACPC 32 may perform up to N flips in order to pass the CRC. The flips may be done accordingly to the error propagation of the specific modulation (GFSK, EDR2, EDR3). Thus, the flips may be done by flipping a bit pair (the weak-bit and the sequential bit). In EDR2/EDR3 two consecutive different symbols may be flipped regardless of estimated data. For example, in EDR2 weak-bits which may have the indices 55 and 58 may be considered as bit pair because they belong to the symbol 28 or 29, respectively.

The interface circuitry 26 may be configured to receive a receive packet. The PHYPC 34 may be configured to demodulate the receive packet into a bit stream representing a sequence of data symbols and determine a respective likelihood of being erroneous for each bit of the bit stream. Further, the PHYPC 34 may be configured to determine a number of weak-bits by comparing the respective likelihood of each bit with a first threshold. Every bit with a likelihood above the first threshold may be determined to be a weak-bit. Further, the PHYPC 34 may be configured to compare the number of weak-bits with a second threshold and if the number of weak-bits exceeds the second threshold reject the bit stream. By utilizing the first and the second threshold the receive packet may by rejected before the transmission from the PHYPC 34 to the MACPC 32 may be performed. For example, the receive packet may be rejected by the PHYPC 34 and not only by the MACPC 32 after receiving the bit stream. Thus, the data transfer between PHYPC 34 and MACPC 32 may be reduced.

For example, the determination of weak-bits may be performed as described above. The PHYPC 34 may be further configured to demodulate the receive packet by soft decision demodulation into the bit stream. Further, the PHYPC 34 may be configured to determine soft information indicating the respective likelihood of being erroneous for the bits in the bit stream and identify the number of weak-bits based on the soft information. The interface circuitry 26 may be further configured to receive a retransmission packet. Further, the PHYPC 34 may be further configured to demodulate symbols of the retransmission packet into a second bit stream. Further, the PHYPC 34 may be configured to apply a bitwise exclusive or operation on the bit stream and the second bit stream in order to generate the third bit stream; and determine the number of weak-bits based on the third bit stream.

A classic decoding algorithm for Bose-Chaudhuri-Hocquenghem (BCH) codes is hard decision minimum distance decoding, which may be implemented via syndrome decoding. The algorithm takes input channel bits and calculate syndromes. The calculated syndromes are mapped to an error pattern and the chosen error pattern are used to correct the channel bits and guarantee a valid continuous wave (CW) at the output.

The interface circuitry 26 may be configured to receive a receive packet. Further, the PHYPC 34 may be configured to demodulate the receive packet into a bit stream representing a sequence of data symbols and to generate syndromes for each bit of the bit stream. Further, the PHYPC 34 may be configured to map the syndromes to a plurality of error groups with different hamming weight. An error pattern of a predefined syndrome may be assigned to each syndrome of an error group of the plurality of error groups. Further, the PHYPC 34 may be configured to decode the bit stream by syndrome decoding. The syndrome decoding may differ between the error groups with different hamming weight.

The BT standard for BR modulation is GFSK, which may flip two consequent bits for every erroneous bit/symbol due to the differential modulation. In order to deal this phenomenon, log-likelihood ratios (LLRs) calculated from the received symbols may be compensated by assuming bursts of errors. For example, an error in one bit may lead to an error in the sequential bit. A soft-metric decoding algorithm may generalize a classic syndrome decoding. The generalization may be that every syndrome may be mapped to some set of error patterns, for each error pattern in the set, a score may be calculated and then the error pattern with the best score may be selected and used for the correction of the received bits.

The syndromes may be a partition of the $2^{15}$ possible binary vectors of 15 bits into $2^5$ sets of $2^{10}$ vectors each, so that every set may be characterized by its syndrome. The syndrome may be partitioned to 3 groups. A first group may contain the syndromes 00000 and 11001, these syndromes may have the quality that if a linear-feedback shift register (LFSR) contain them, it gets stuck on them if it keeps ticking, where 00000 indicates the valid CWs.

A second group may comprise all the syndromes with an even Hamming weight greater than zero and a third group may comprise the remaining syndromes (all the syndromes with odd Hamming weight except 11001). Each of the last two groups, the second and the third group, may have periodicity within themselves, meaning the LFSR tick may move from state 10000 to 01000 and then to 00100 and so on until it may go to all of the states of the group and after 15 clock cycles may go back to the first state. In addition, all the vectors in these sets of the syndrome 01000 are exactly one circular shift of the vectors that belong to the syndrome 10000. This attribute may be utilized to simplify the decoder implementation. It may be done by keeping LUT for error patterns only for one syndrome from each group. For example, the second and third error group may have a different hamming weight and thus, for both error groups the syndrome decoding may be performed in different ways.

For example, for the group of syndromes with even Hamming weight (the second group) the syndrome decoding may be as follows. For, example a set of error patterns may be kept only for the second group and only for the syndrome 00011. For example, only for the syndrome 00011 an error pattern may be kept. A receiving of a vector may be assumed and its syndrome may be calculated and may got 11011. Applying the LFSR tick 4 times while also applying 4 circular shifts on the 15 bits vector a resulting error pattern relevant for the syndrome 00011 may be equivalent to use as error pattern needed for the syndrome 11011. For any other syndrome in this group some other number of cyclic shifts may move the LFSR to state 00011. Thus, the error patterns needed for each symbol of the second group may be related to the error patterns (set of error patterns) of the syndrome 00011.

For example, for the group of syndromes with odd Hamming weight (the third group) an occurring of the errors in bursts of 2 bits may be assumed. Thus, a different logic to this for the second group may be used. One error pattern may be 3 consequent errors (that may represent all its 15 cyclic shifts) and may always be valid for comparing its score but the other patterns contain a single error, so only the versions with single errors on edges may be valid for comparing the score. For example, by considering the bursts of error in 2 bits the PHYPC 34 may be enabled to flip bits in bit pairs during decoding. The PHYPC 34 may be configured to flip a bit pair (e.g. the weak-bit and the sequential bit) by the syndrome decoding. Thus, the resulting bit stream may be improved by applying the different decoding operations on the first, second and third group by allowing the PHYPC 34 to flip bits in bit pairs before transmitting the bit stream to the MACPC 32.

The PHYPC 34 may be further configured to use a linear-feedback shift register to decode the bit stream by syndrome decoding. The PHYPC 34 may further configured to use a circular shift to decode the bit stream by syndrome decoding.

An electronic device 90 may comprise a BT receiver 30 as described above. The electronic device 90 may be a mobile device such as, e.g., a mobile phone, a smart phone, a tablet-computer or a laptop-computer.

The performance of the BT receiver described above may be increased by the following values for different Standards (packet error rate, PER; bit error rate, BER, BT low energy, BLE).

TABLE 1

BR simulation results - up to 6 flips.

| Payload length | PER gain @ PER00.1 | BER gain @ BER = $1e^{-3}$ |
|---|---|---|
| 30 Bytes | 1.9 dB | 1.2 dB |
| 187 Bytes | 1.4 dB | 0.5 dB |
| 343 Bytes | 1.3 dB | 0.3 dB |

TABLE 2

BLE simulation results - up to 6 flips.

| Payload length | PER gain @ PER00.1 | BER gain @ BER = $1e^{-3}$ |
|---|---|---|
| 30 Bytes | 1.7 dB | 1.3 dB |
| 187 Bytes | 1.3 dB | 0.5 dB |
| 343 Bytes | 1.2 dB | 0.3 dB |

TABLE 3

EDR 2 simulation results - up to 6 flips.

| Payload length | PER gain @ PER00.1 | BER gain @ BER = $1e^{-3}$ |
|---|---|---|
| 58 Bytes | 1.4 dB | 1.5 dB |
| 371 Bytes | 1.2 dB | 0.8 dB |
| 687 Bytes | 1.1 dB | 0.7 dB |

TABLE 4

EDR 3 simulation results - up to 6 flips.

| Payload length | PER gain @ PER00.1 | BER gain @ BER = $1e^{-3}$ |
|---|---|---|
| 58 Bytes | 0.9 dB | 0.9 dB |
| 371 Bytes | 1.1 dB | 0.6 dB |
| 687 Bytes | 1.2 dB | 0.5 dB |

TABLE 5 third bit stream generated by XOR on the receive packet and the retransmission packet.

| Payload length | PER gain @ PER00.1 | BER gain @ BER = $1e^{-3}$ |
|---|---|---|
| 60 Bytes | 2.7 dB | 2.2 dB |
| 256 Bytes | 2.3 dB | 1.2 dB |

More details and aspects are mentioned in connection with the examples described below. The example shown in FIG. 1 may comprise one or more optional additional features corresponding to one or more aspects mentioned in connection with the proposed concept or one or more examples described below (e.g. FIGS. 2-9).

Figure 2:
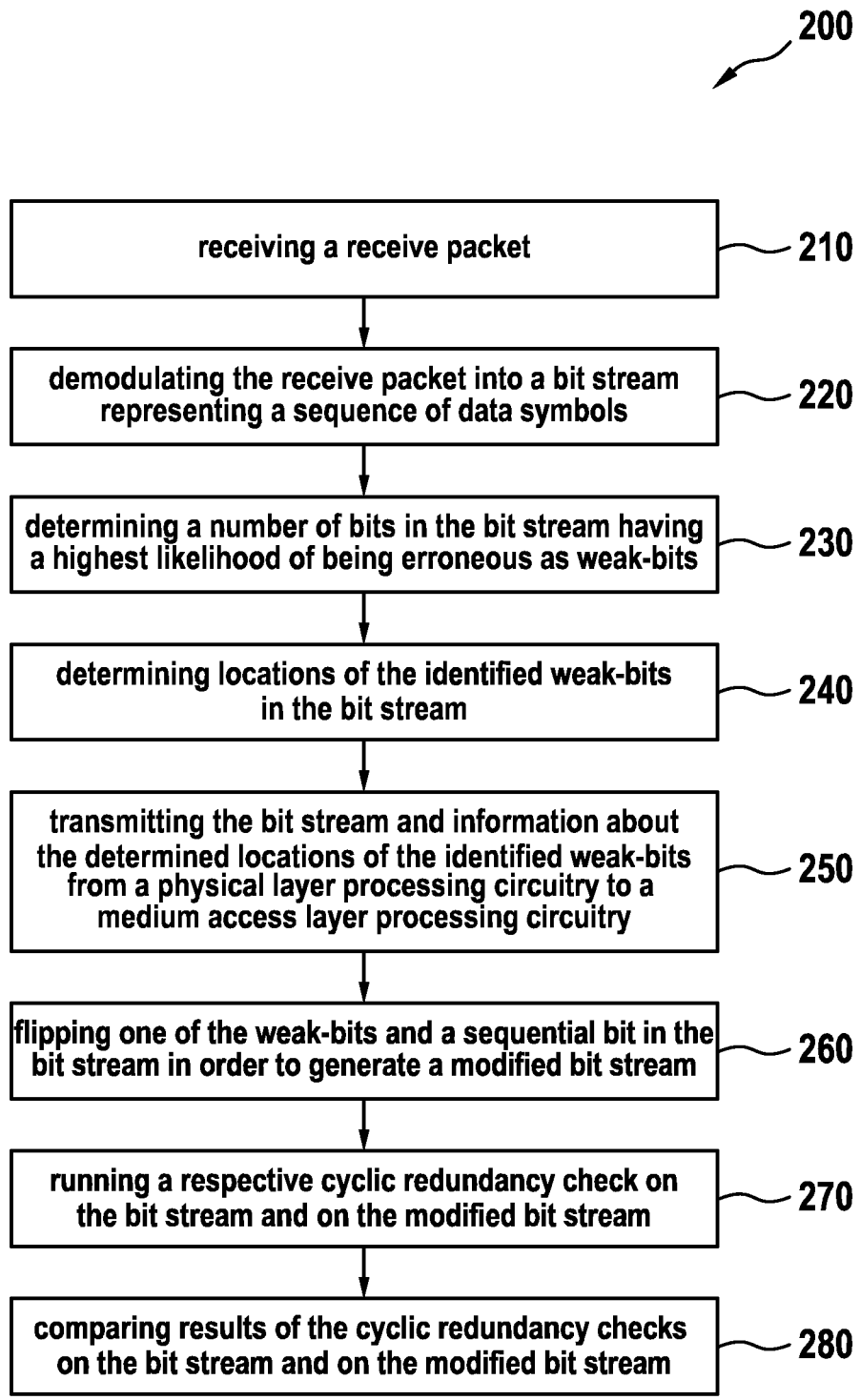
FIG. 2 shows a flow-chart of an example of a method for a BT receiver.

FIG. 2 shows a flow-chart of an example of a method 200 for a BT receiver. The method 200 comprises receiving 210 a receive packet by PHYPC and demodulating 220, by the PHYPC, the receive packet into a bit stream representing a sequence of data symbols. Further, the method 200 comprises determining 230, by the PHYPC, a number of bits in the bit stream having a highest likelihood of being erroneous as weak-bits. The method additionally comprises determining 240, by the PHYPC, locations of the identified weak-bits in the bit stream. Further, the method 200 comprises transmitting 250, by the PHYPC, the bit stream and information about the determined locations of the identified weak-bis from the PHYPC to a MACPC. In addition, the method comprises flipping 260, by the MACPC, one of the weak-bits and a sequential bit in the bit stream in order to generate a modified bit stream. Further, the method 200 comprises running 270, by the MACPC, a respective cyclic redundancy check on the bit stream and on the modified bit stream. The method additionally comprises comparing 280, by the MACPC, results of the cyclic redundancy checks on the bit stream and on the modified bit stream.

More details and aspects are mentioned in connection with the examples described above and/or below. The example shown in FIG. 2 may comprise one or more optional additional features corresponding to one or more aspects mentioned in connection with the proposed concept or one or more examples described above (e.g. FIG. 1) and/or below (e.g. FIGS. 3-9).

Figure 3:
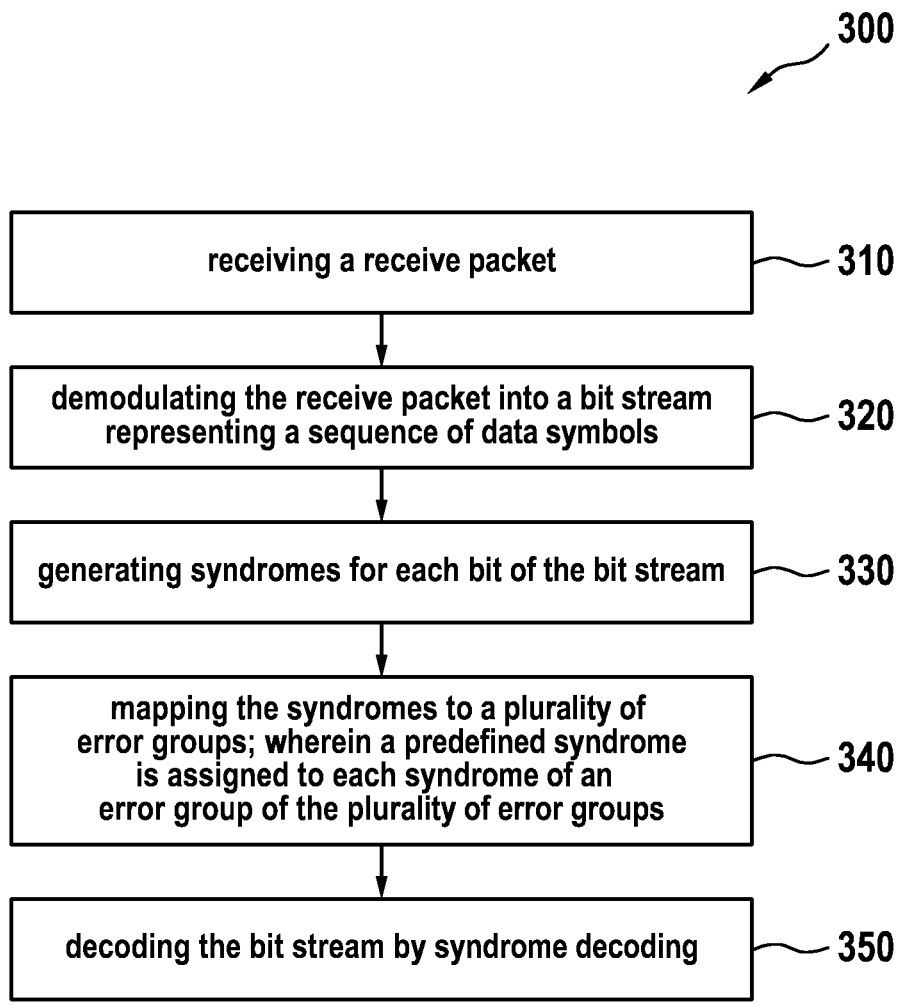
FIG. 3 shows a flow-chart of another example of a method for a BT receiver.

FIG. 3 shows a flow-chart of another example of a method 300 for a BT receiver. The method 300 comprises receiving 310 a receive packet and demodulating 320 the receive packet into a bit stream representing a sequence of data symbols. Further, the method 300 comprises generating 330 syndromes for each bit of the bit stream and mapping 340 the syndromes to a plurality of error groups. A predefined syndrome is assigned to each syndrome of an error group of the plurality of error groups. Further, the method 300 comprises decoding 350 the bit stream by syndrome decoding.

More details and aspects are mentioned in connection with the examples described above and/or below. The example shown in FIG. 3 may comprise one or more optional additional features corresponding to one or more aspects mentioned in connection with the proposed concept or one or more examples described above (e.g. FIGS. 1-2) and/or below (e.g. FIGS. 4-9).

Figure 4:
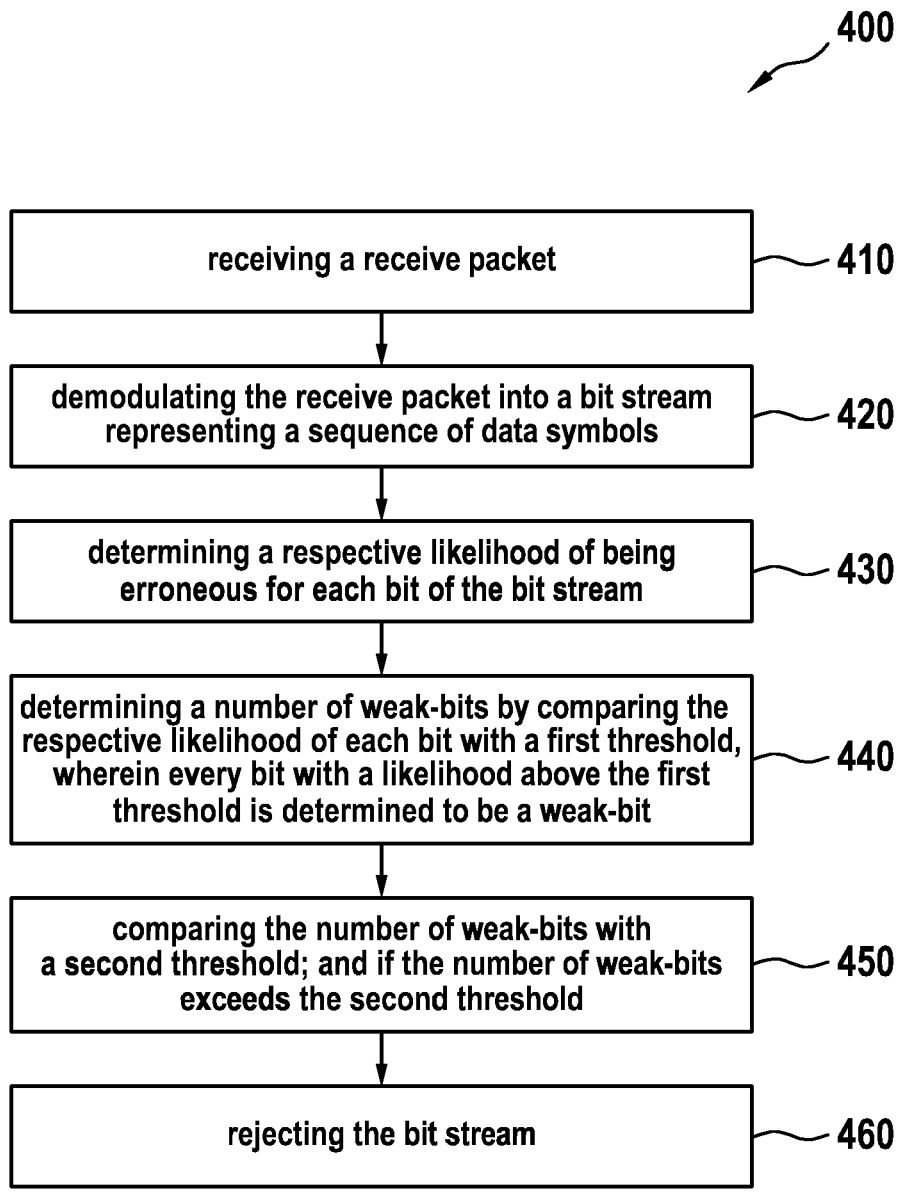
FIG. 4 shows a flow-chart of another example of a method for a BT receiver.

FIG. 4 shows a flow-chart of another example of a method 400 for a BT receiver. The method 300 comprises receiving 410 a receive packet and demodulating 420 the receive packet into a bit stream representing a sequence of data symbols. Further, the method 400 comprises determining 430 a respective likelihood of being erroneous for each bit of the bit stream. Further, the method 400 comprises determining 440 a number of weak-bits by comparing the respective likelihood of each bit with a first threshold. Every bit with a likelihood above the first threshold is determined to be a weak-bit. Further, the method 400 comprises comparing 450 the number of weak-bits with a second threshold; and if the number of weak-bits exceeds the second threshold and 460 rejecting the bit stream.

More details and aspects are mentioned in connection with the examples described above and/or below. The example shown in FIG. 4 may comprise one or more optional additional features corresponding to one or more aspects mentioned in connection with the proposed concept or one or more examples described above (e.g. FIG. 1-3) and/or below (e.g. FIGS. 5-9).

Figure 5:
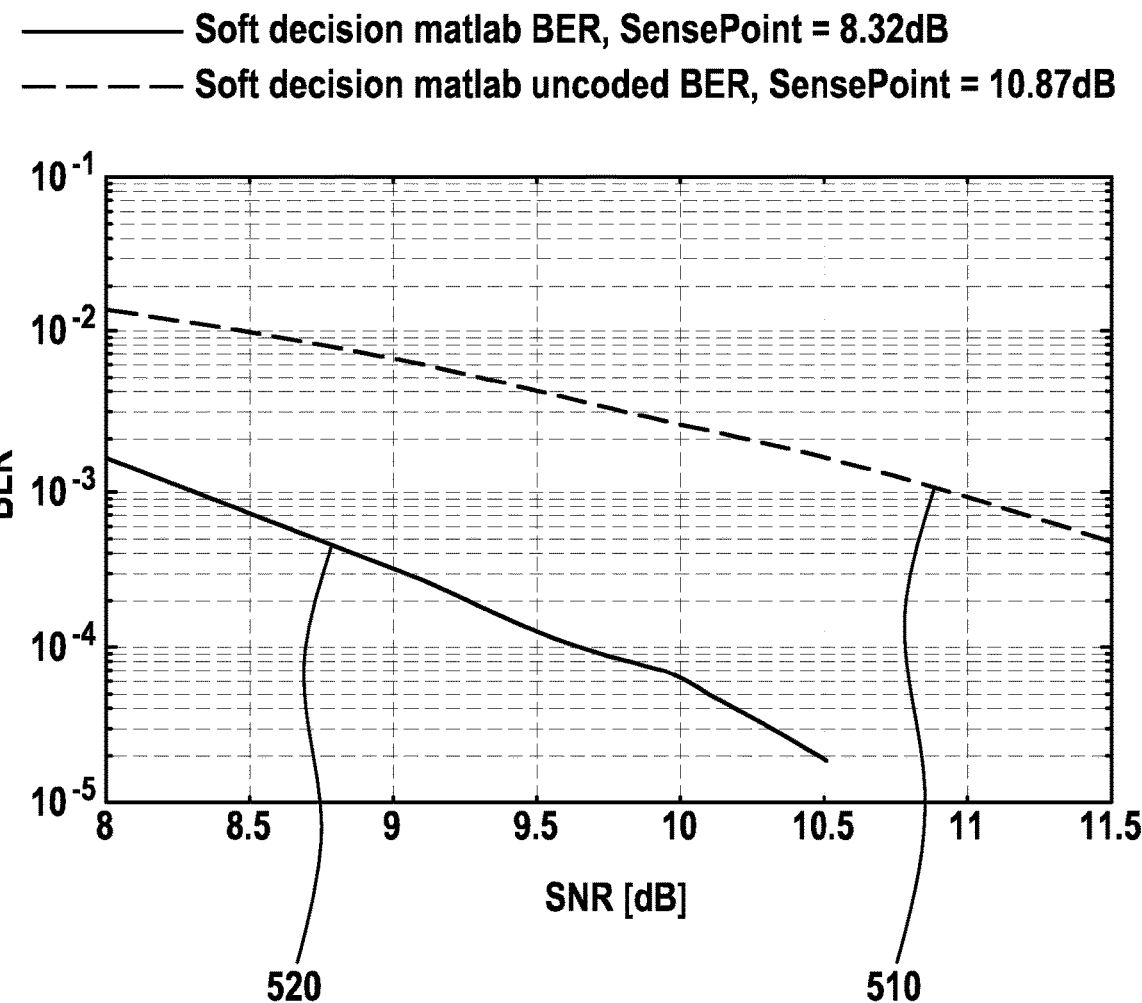
FIG. 5 shows exemplary courses of a bit error rate as a function of a signal to noise ratio for different BT receivers.

FIG. 5 shows exemplary courses of a bit error rate as a function of a signal to noise ratio for different BT receivers. The simulation depicts a simulation for an uncoded BER 510 (e.g. classical soft-decision decoder) and for an BER 520, decoded with different groups as described above, enabling the PHYPC to flip bits in bit pairs. A significant decrease in the BER may be seen. Thus, the decoding with different groups may increase the performance of the BT receiver.

More details and aspects are mentioned in connection with the examples described above and/or below. The example shown in FIG. 5 may comprise one or more optional additional features corresponding to one or more aspects mentioned in connection with the proposed concept or one or more examples described above (e.g. FIGS. 1-4) and/or below (e.g. FIGS. 6-9).

FIG. 6 shows different logic circuits for determining the sequential bit. FIG. 6a shows a logic circuit for determining the location of a bit. The XOR may be applied on the two bits of the relevant symbol $S_n$. After applying the XOR on the first (relevant) demodulated data symbol $S_n$ a parity bit may be added to a result and than the XNOR may be applied on the result of the XOR and the signum function leading to the location L. exclusive or operation.

Figure 6B:
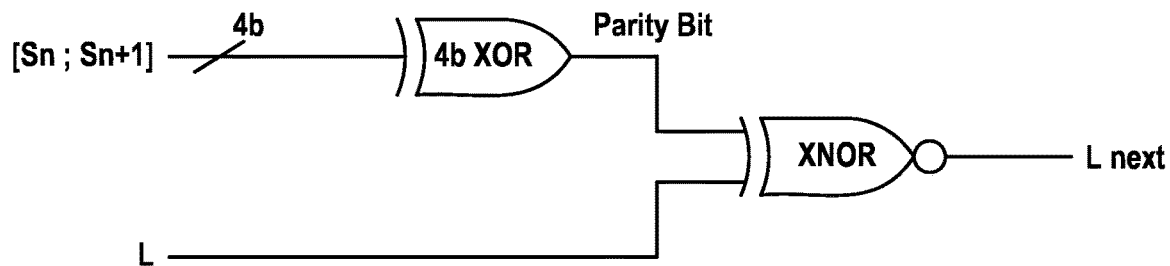

FIG. 6b shows a logic circuit for determining the location of the next symbol bit error. The XOR may be applied on the four bits of the relevant symbol $S_n$ and the next symbol $S_{n+1}$. After applying the XOR on the first (relevant) demodulated data symbol $S_n$ and the second (next) demodulated data symbol $S_{n+1}$ a parity bit may be added to a result and than the XNOR may be applied on the result of the XOR and the determined L leading to the location of the next symbol bit error $L^{next}$.

Figure 6C:
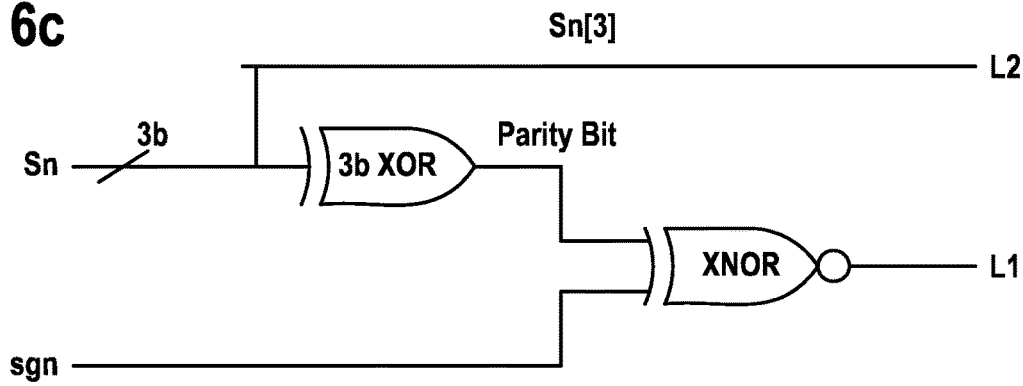

FIG. 6c shows a logic circuit for determining the location of a bit. $L_2=s_n[3]$ may be chosen as the last bit of the symbol $L_2$, which comprises three symbols. Hence, the error bit location may be defined by applying the XOR. The XOR may be applied on the three bits of the relevant symbol $S_n$. $L_2$, the location of the last bit, may be determined without applying the XOR. After applying the XOR on the first (relevant) demodulated data symbol $S_n$ a parity bit may be added to a result and than the XNOR may be applied on the result of the XOR and the signum function leading to the location $L_1$.

Figure 6D:
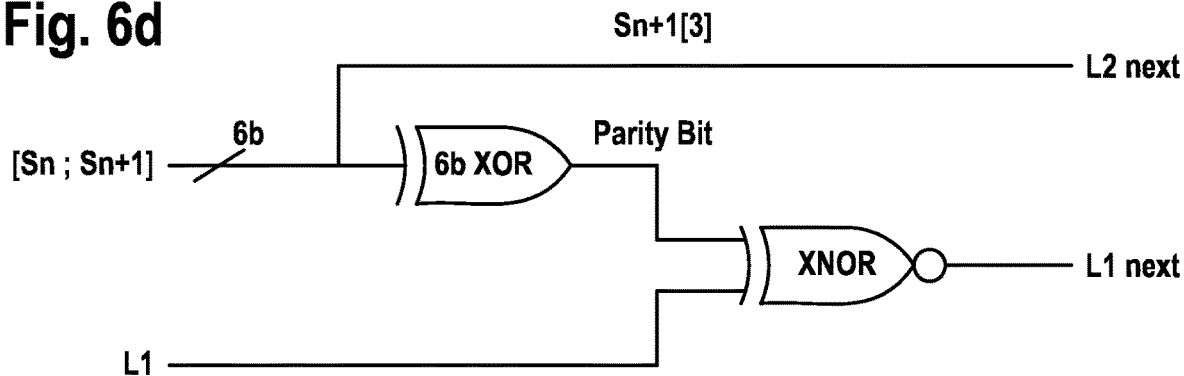

FIG. 6d shows a logic circuit for determining the location of the next symbol bit error. The value of $L_2^{next}$ may be determined by the second bit that may be flipped. From FIG. 6a, it follows that the value of $L_2^{next}$ may be determined according to the next symbol LSB. Hence, $L_1^{next}$ and $L_2^{next}$ ($L_2^{next}=\hat{s}_{n+1}[3]$) may be determined by applying the XOR. The XOR may be applied on the six bits of the relevant symbol $S_n$ and the next symbol $S_{n+1}$. $L_2^{next}$, the location of the last bit in the next symbol, may be determined without applying the XOR. After applying the XOR on the first (relevant) demodulated data symbol $S_n$ and the second (next) demodulated data symbol $S_{n+1}$ a parity bit may be added to a result and than the XNOR may be applied on the result of the XOR and the determined $L_1$ leading to the location of the next symbol bit error $L_1^{next}$ (see also FIG. 6d).

More details and aspects are mentioned in connection with the examples described above and/or below. The example shown in FIG. 6 may comprise one or more optional additional features corresponding to one or more aspects mentioned in connection with the proposed concept or one or more examples described above (e.g. FIGS. 1-5) and/or below (e.g. FIGS. 7-9).

Figure 7:
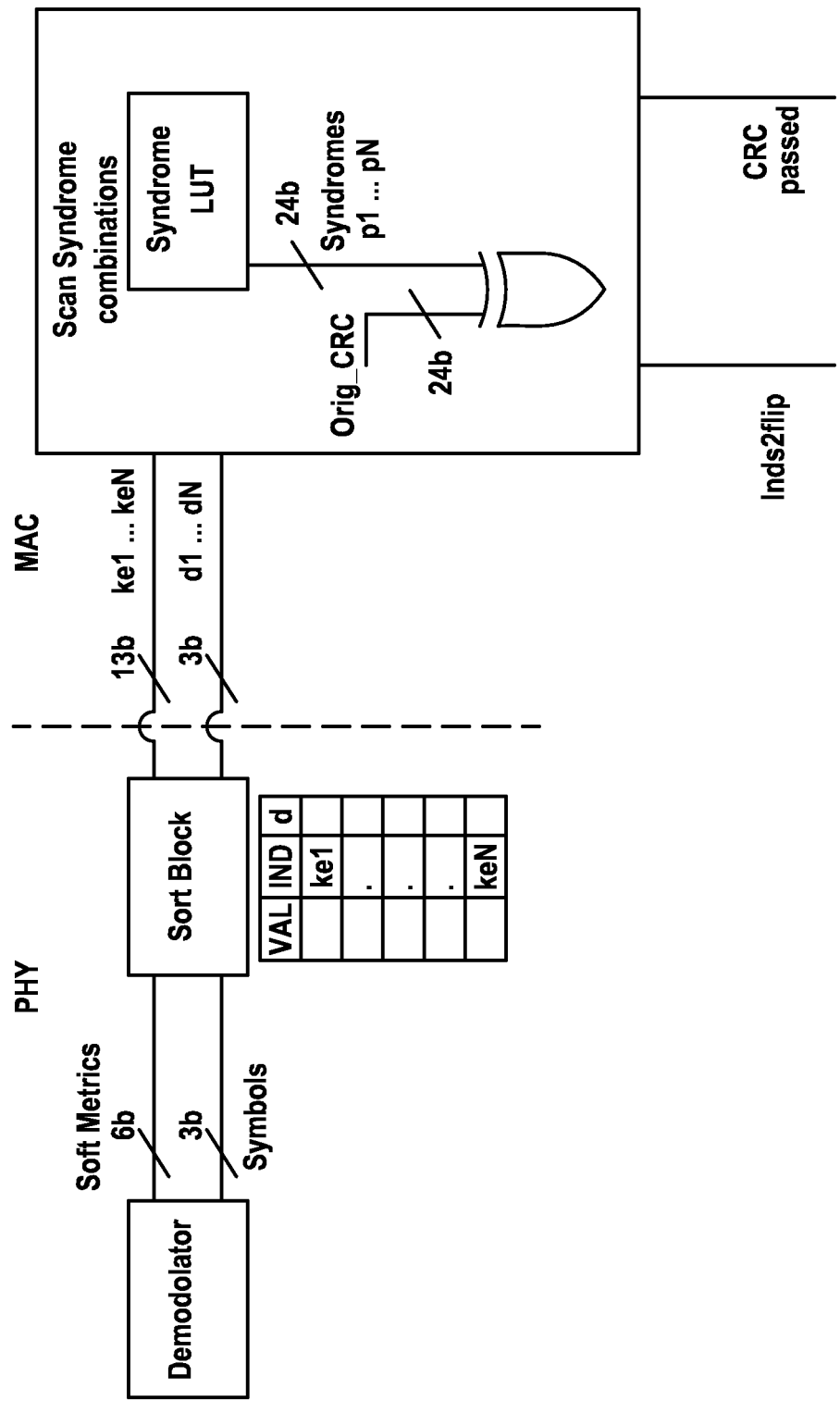
FIG. 7 shows a logic circuit for performing a cyclic redundancy check based on lookup tables with syndromes.

FIG. 7 shows a logic circuit for performing the CRC based on LUT with syndromes. The demodulator may generate symbols and soft-metrics assigned to the symbols. One (weak) symbol may comprise three bits and the assigned soft-metric may comprise six bits. The sort block may sort the weak-bits in an order of likelihood for being erroneous. For example, the weak-bit with the highest likelihood of being erroneous may be assigned as bit $k_{e1}$ and a location for this bit may be linked to this bit. This may be done or all weak-bit ending up with a bit $k_{eN}$. The order of the weak-bits and the location of each weak-bit may be transmitted form the PHYPC to the MACPC and the LUT with syndromes may be generated. For example, 24 syndromes $p_1 \ldots p_n$ may be generated. The XNOR may be applied on the syndromes generated for the weak-bits and on the syndromes generated for the first CRC. If the CRC is passed any further flip of one weak-bit may be omitted, else two bits are flipped to generate modified bit stream, one weak-bit and the sequential bit.

More details and aspects are mentioned in connection with the examples described above and/or below. The example shown in FIG. 7 may comprise one or more optional additional features corresponding to one or more aspects mentioned in connection with the proposed concept or one or more examples described above (e.g. FIGS. 1-6) and/or below (e.g. FIGS. 8-9).

Figure 8:
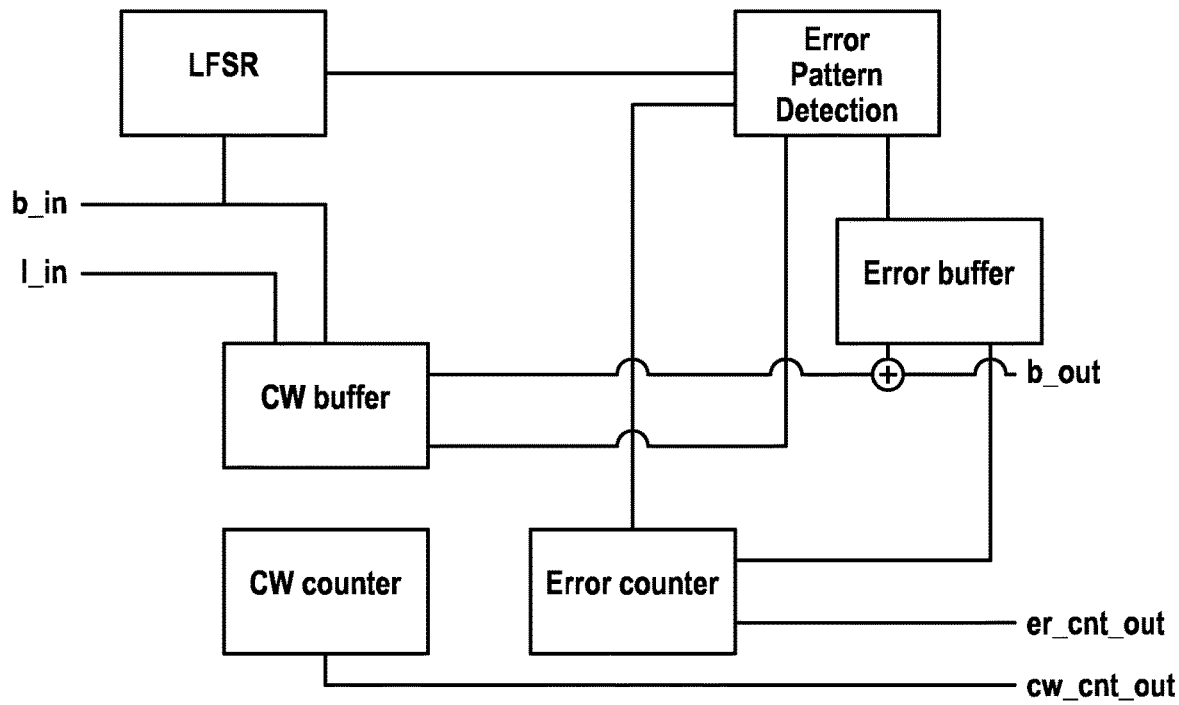
FIG. 8 shows a block diagram of circuitry for soft decoding.

FIG. 8 shows a block diagram of circuitry for soft decoding. The circuitry comprises a LFSR block, an error pattern detection block, an error buffer block, a CW buffer block, a CW counter block and an error counter block. An input parameter may be a (channel) bit stream $b_{in}$ for the LF SR block. The LF SR block may calculate syndromes, which may be mapped to an error pattern by the error pattern detection block. These error pattern may be utilized in the error buffer block to correct the (channel) bit stream. The corrected (channel) bit stream may be combined with a signal from the CW buffer block to generate a (channel) bit stream output.

More details and aspects are mentioned in connection with the examples described above and/or below. The example shown in FIG. 8 may comprise one or more optional additional features corresponding to one or more aspects mentioned in connection with the proposed concept or one or more examples described above (e.g. FIGS. 1-7) and/or below (e.g. FIGS. 8-9).

Figure 9:
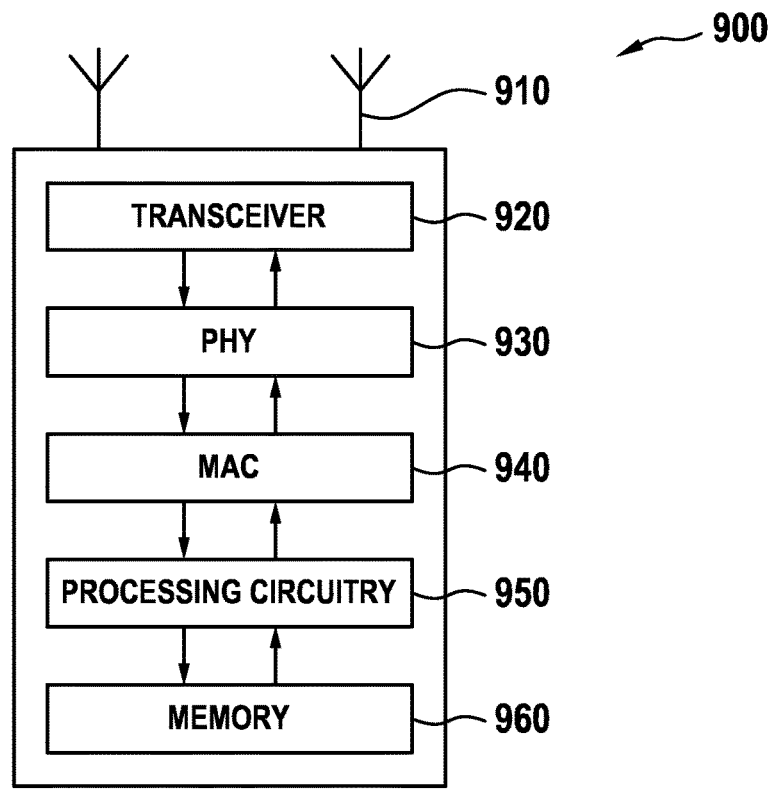
FIG. 9 shows a block diagram of an example of a wireless communication device.

FIG. 9 shows a block diagram of an example of a wireless communication device 900. In accordance with various examples, wireless communication device 900 may include, among other things, a transmit/receive element 910 (for example an antenna), a transceiver 920, physical circuitry 930 (PHYC), and media access control circuitry 940 (MACC). The PHYC may be/comprise the PHYPC as described above. The MACC may be/comprise the MACPC as described above. The PHYC circuitry 930 and MACC circuitry 940 may be compliant with one or more wireless standards such as IEEE 802.11 standards and/or Bluetooth™ (Low Energy). The PHYC circuitry 930 may include circuitry for modulation/demodulation, upconversion/downconversion, filtering, amplification, etc. In some examples, the transmit/receive elements 910 may be two or more antennas that may be coupled to the PHYC circuitry 930 and arranged for sending and receiving signals.

Wireless communication device 900 may also include processing circuitry 950 and memory 960 configured to perform the various operations described herein. The circuitry 950 may be configured to perform functions based on instructions being stored in a RAM or ROM, or based on special purpose circuitry. The circuitry 950 may include one or more processors, such as a general-purpose processor or special purpose processor, and/or processing circuitry in accordance with some examples. The circuitry 950 may implement one or more functions associated with the transceiver 920, the PHYC circuitry 930, the MACC circuitry 940, and/or the memory 960. The circuitry 950 may be coupled to the transceiver 920, which may be coupled to the transmit/receive element 910. While FIG. 9 depicts the circuitry 950 and the transceiver 920 as separate components, the circuitry 950 and the transceiver 920 may be integrated together in an electronic package or chip.

In some examples, a wireless communication device 900 may be part of a portable wireless communication device, such as a personal digital assistant (PDA), a laptop or portable computer with wireless communication capability, a web tablet, a wireless telephone, a smartphone, a wireless headset, a pager, an instant messaging device, a digital camera, an access point, a television, a medical device (e.g., a heart rate monitor, a blood pressure monitor, etc.), an access point, a base station, a transmit/receive device for a wireless standard such as Bluetooth or IEEE 802.11, or other device that may receive and/or transmit information wirelessly. In some examples, the wireless communication device may include one or more of a keyboard, a display, anon-volatile memory port, multiple antennas, a graphics processor, an application processor, speakers, and other mobile device elements. The display may be an LCD screen including a touch screen.

Although the Wireless communication device 900 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some examples, the functional elements may refer to one or more processes operating on one or more processing elements.

Some examples may be implemented fully or partially in software and/or firmware. This software and/or firmware may take the form of instructions contained in or on a non-transitory computer-readable storage medium. Those instructions may then be read and executed by one or more processors to enable performance of the operations described herein. Those instructions may be read and executed by one or more processors to cause the device 900 to perform the methods and/or operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read only memory (ROM); random access memory (RAM); magnetic disk storage media; optical storage media; a flash memory, etc.

More details and aspects are mentioned in connection with the examples described above. The example shown in FIG. 9 may comprise one or more optional additional features corresponding to one or more aspects mentioned in connection with the proposed concept or one or more examples described above (e.g. FIGS. 1-8).

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The examples described herein may be summarized as follows:

Example 1 is a Bluetooth receiver, comprising: interface circuitry configured to receive a receive packet; physical layer processing circuitry configured to: demodulate the receive packet into a bit stream representing a sequence of data symbols; determine a number of bits in the bit stream having a highest likelihood of being erroneous as weak-bits; and determine locations of the identified weak-bits in the bit stream; medium access control layer processing circuitry configured to: receive the bit stream and information about the determined locations of the identified weak-bits from the physical layer processing circuitry: flip one of the weak-bits and a sequential bit in the bit stream in order to generate a modified bit stream; run a respective cyclic redundancy check on the bit stream and the modified bit stream; and compare results of the cyclic redundancy checks on the bit stream and on the modified bit stream.

Example 2 is the receiver according to example 1, wherein the physical layer processing circuitry is configured to: demodulate the receive packet by soft decision demodulation into the bit stream, determine soft information indicating the respective likelihood of being erroneous for the bits in the bit stream, and identify the number of weak-bits based on the soft information.

Example 3 is the receiver according to any of the preceding examples, wherein the physical layer processing circuitry is further configured to sort the weak-bits in the bit stream in an order of the likelihood of being erroneous; and wherein the medium access control layer processing circuitry is further configured to flip one of the weak-bits and the sequential bit in the bit stream based on the order of the likelihood of being erroneous.

Example 4 is the receiver according to example 1, wherein the interface circuitry is further configured to receive a retransmission packet; and the physical layer processing circuitry is further configured to: demodulate the retransmission packet into a second bit stream; apply a bitwise exclusive or operation on the bit stream and the second bit stream in order to generate a third bit stream; and determine the number of weak-bits based on the third bit stream.

Example 5 is the receiver according to example 4, wherein the physical layer processing circuitry is configured to determine every bit of value "1" in the third bit stream as weak-bit.

Example 6 is the receiver according to any of the preceding examples, wherein each demodulated data symbol in the sequence of demodulated data symbols is represented by at least two bits in the bit stream; the one of the weak-bits belongs to a first demodulated data symbol in the sequence of demodulated data symbols; and the sequential bit belongs to a second demodulated data symbol in the sequence of demodulated data symbols that immediately follows the first demodulated data symbol in the sequence of demodulated data symbols.

Example 7 is the receiver according to example 6, wherein the physical layer processing circuitry is further configured to determine a bit among the bits belonging to the second demodulated data symbol with the highest likelihood for being erroneous based on a least significant bit and a most significant bit among the bits belonging to the second demodulated data symbol.

Example 8 is the receiver according to any one of examples 6-7, wherein the physical layer processing circuitry is further configured to apply a bitwise exclusive or operation on bits belonging to the first demodulated data symbol to determine a bit with the highest likelihood of being erroneous in the sequential symbol.

Example 9 is the receiver according to any one of the preceding examples, wherein if the bit stream fails its cyclic redundancy check and the modified bit stream passes its cyclic redundancy check, the medium access control layer processing circuitry is further configured to further process only the modified bit stream among the bit stream and the modified bit stream.

Example 10 is the receiver according to any one of examples 1-8, wherein if the bit stream and the modified bit stream fails its cyclic redundancy check, the medium access control layer processing circuitry is further configured to perform the following iterative processing in i-th iterations with 1<i, wherein i is a number of weak-bit permutations with one flip of a weak-bit at a time: flip one weak-bit and a sequential bit in a bit stream of the (i−1)-th iteration in order to generate a bit stream of the i-th iteration with an unused permutation of weak-bits, wherein the modified bit stream is used as the bit stream of the (i−1)-th iteration for the first iteration; run the cyclic redundancy check on the bit stream of the i-th iteration; and determine whether one of the following stop conditions is fulfilled: a) the bit stream of the i-th iteration passes the cyclic redundancy check or b) all permutations of weak-bit are used to generate a bit stream of the (i)-th iteration; and stop the iterative processing if one of the stop conditions is fulfilled.

Example 11 is the receiver according to example 10, wherein the medium access control layer processing circuitry is further configured to further process only the modified bit stream of the i-th iteration among the bit stream and the modified bit streams if stop condition a) is fulfilled.

Example 12 is the receiver according to example 10, wherein the medium access control layer processing circuitry is further configured to reject the bit stream if stop condition b) is fulfilled.

Example 13 is the receiver according to any one of examples 1-8, wherein if the bit stream and the modified bit stream pass the respective cyclic redundancy check, the medium access control layer processing circuitry is further configured to reject the bit stream.

Example 14 is the receiver according to any one of examples 1-8, wherein if the bit stream passes its cyclic redundancy check and the modified bit stream fails its cyclic redundancy check, the medium access control layer processing circuitry is further configured to perform the following iterative processing in i-th iterations with 1<i, wherein i is a number of weak-bit permutation with one flip of a weak-bit at a time: flip one weak-bit and a sequential bit in a bit stream of the (i−1)-th iteration in order to generate a bit stream of the i-th iteration with an unused permutation of weak-bits, wherein the modified bit stream is used as the bit stream of the (i−1)-th iteration for the first iteration; run the cyclic redundancy check on the bit stream of the i-th iteration; and determine whether one of the following stop conditions is fulfilled: a) the bit stream of the i-th iteration passes the cyclic redundancy check or b) all permutations of weak-bit are used to generate a bit stream of the (i)-th iteration; and stop the iterative processing if one of the stop conditions is fulfilled.

Example 15 is the receiver according to example 14, wherein the medium access control layer processing circuitry is further configured to reject the bit stream if stop condition a) is fulfilled.

Example 16 is the receiver according to example 14, wherein the medium access control layer processing circuitry is further configured to further process only the modified bit stream of the i-th iteration among the bit stream and the modified bit streams if stop condition b) is fulfilled.

Example 17 is the receiver according to any one of the preceding examples, wherein the medium access control layer processing circuitry is further configured to: generate a lookup table with syndromes for the bit stream in order to syndrome decode the bit stream; and run the cyclic redundancy check on the bit stream by running the cyclic redundancy check on the syndromes.

Example 18 is the receiver according to example 17, wherein the medium access control layer processing circuitry is further configured to: generate syndromes for flipped weak-bits;

modify the lookup table with the syndromes of flipped weak-bits in order to generate a modified lookup table for each weak-bit permutation with one flip of a weak-bit at a time of the bit stream; and run the cyclic redundancy check with all modified lookup tables, wherein the cyclic redundancy check is passed if it is passed for only one of the modified lookup tables.

Example 19 is a Bluetooth receiver, comprising: interface circuitry configured to receive a receive packet; physical layer processing circuitry configured to: demodulate the receive packet into a bit stream representing a sequence of data symbols; generate syndromes for each bit of the bit stream; map the syndromes to a plurality of error groups with different hamming weight, wherein an error pattern of a predefined syndrome is assigned to each syndrome of an error group of the plurality of error groups; and decode the bit stream by syndrome decoding, wherein the syndrome decoding differs be-tween the error groups with different hamming weight.

Example 20 is the Bluetooth receiver according to claim 19, wherein the physical layer processing circuitry is further configured to flip a bit pair by the syndrome decoding.

Example 21 is the receiver according to any one of examples 19-20, wherein the physical layer processing circuitry is further configured to use a linear-feedback shift register to decode the bit stream by syndrome decoding.

Example 22 is the receiver according to any one of examples 19-21, wherein the physical layer processing circuitry is further configured to use a circular shift to decode the bit stream by syndrome decoding.

Example 23 is a Bluetooth receiver, comprising: interface circuitry configured to receive a receive packet; physical layer processing circuitry configured to: demodulate the receive packet into a bit stream representing a sequence of data symbols; determine a respective likelihood of being erroneous for each bit of the bit stream; determine a number of weak-bits by comparing the respective likelihood of each bit with a first threshold, wherein every bit with a likelihood above the first threshold is determined to be a weak-bit; and compare the number of weak-bits with a second threshold; and if the number of weak-bits exceeds the second threshold reject the bit stream.

Example 24 is the Bluetooth receiver according to example 23, wherein the physical layer processing circuitry is further configured to demodulate the receive packet by soft decision demodulation into the bit stream, determine soft information indicating the respective likelihood of being erroneous for the bits in the bit stream, and identify the number of weak-bits based on the soft information.

Example 25 is the Bluetooth receiver according to example 23, wherein the interface circuitry is further configured to receive a retransmission packet; and the physical layer processing circuitry is further configured to demodulate symbols of the retransmission packet into a second bit stream; apply a bitwise exclusive or operation on the bit stream and the second bit stream in order to generate a third bit stream; and determine the number of weak-bits based on the third bit stream.

Example 26 is an electronic device comprising a Bluetooth receiver according to any one of the preceding examples.

Example 27 is the electronic device of example 26, wherein the electronic device is a mobile device.

Example 28 is a method for a Bluetooth receiver, comprising receiving a receive packet; demodulating the receive packet into a bit stream representing a sequence of data symbols; determining a number of bits in the bit stream having a highest likelihood of being erroneous as weak-bits; determining locations of the identified weak-bits in the bit stream; transmitting the bit stream and information about the determined locations of the identified weak-bits from a physical layer processing circuitry to a medium access layer processing circuitry; flipping one of the weak-bits and a sequential bit in the bit stream in order to generate a modified bit stream; running a respective cyclic redundancy check on the bit stream and on the modified bit stream; and comparing results of the cyclic redundancy checks on the bit stream and on the modified bit stream.

Example 29 is a method for a Bluetooth receiver, comprising: receiving a receive packet; demodulating the receive packet into a bit stream representing a sequence of data symbols; generating syndromes for each bit of the bit stream; mapping the syndromes to a plurality of error groups with different hamming weight, wherein an error pattern of a predefined syndrome is assigned to each syndrome of an error group of the plurality of error groups; and decoding the bit stream by syndrome decoding, wherein the syndrome decoding differs be-tween the error groups with different hamming weight.

Example 30 is a method for a Bluetooth receiver, comprising: receiving a receive packet;

demodulating the receive packet into a bit stream representing a sequence of data symbols;

determining a respective likelihood of being erroneous for each bit of the bit stream; determining a number of weak-bits by comparing the respective likelihood of each bit with a first threshold, wherein every bit with a likelihood above the first threshold is determined to be a weak-bit; comparing the number of weak-bits with a second threshold; and if the number of weak-bits exceeds the second threshold; and rejecting the bit stream.

The following examples are hereby incorporated in the detailed description, wherein each example may stand on its own as a separate example. It should also be noted that although in the examples a dependent example refers to a particular combination with one or more other examples, other examples may also include a combination of the dependent example with the subject matter of any other dependent or independent example. Such combinations are hereby explicitly proposed, unless it is stated in the individual case that a particular combination is not intended. Furthermore, features of an example should also be included for any other independent example, even if that example is not directly defined as dependent on that other independent example.

What is claimed is:
1. A Bluetooth receiver, comprising:
interface circuitry configured to receive a receive packet;
physical layer processing circuitry configured to:
demodulate the receive packet into a bit stream representing a sequence of data symbols;

identify a number of bits in the bit stream having a highest likelihood of being weak-bits; and
determine locations of the identified weak-bits in the bit stream; and
medium access control layer processing circuitry configured to:
receive the bit stream and information about the determined locations of the identified weak-bits from the physical layer processing circuitry;
generate a modified bit stream by flipping a first bit of the identified weak-bits and a sequential bit to the first bit in the bit stream;
run a respective cyclic redundancy check on the bit stream and the modified bit stream; and
compare results of the cyclic redundancy checks on the bit stream and on the modified bit stream.

2. The Bluetooth receiver according to claim 1, wherein the physical layer processing circuitry is configured to:
demodulate the receive packet by soft decision demodulation into the bit stream,
determine soft information indicating the respective likelihood of being weak-bits for the bits in the bit stream, and
identify the number of weak-bits based on the soft information.

3. The Bluetooth receiver according to claim 1, wherein the physical layer processing circuitry is further configured to sort the identified weak-bits in the bit stream in an order of the likelihood of being weak-bits; and
wherein the medium access control layer processing circuitry is further configured to generate the modified bit stream based on the order of the likelihood of being weak-bits.

4. The Bluetooth receiver according to claim 1, wherein the interface circuitry is further configured to receive a retransmission packet; and
the physical layer processing circuitry is further configured to:
demodulate the retransmission packet into a second bit stream;
apply a bitwise exclusive or operation on the bit stream and the second bit stream in order to generate a third bit stream; and
determine the number of weak-bits based on the third bit stream.

5. The Bluetooth receiver according to claim 1, wherein
each demodulated data symbol in the sequence of demodulated data symbols is represented by at least two bits in the bit stream;
the first bit of the identified weak-bits belongs to a first demodulated data symbol in the sequence of demodulated data symbols; and
the sequential bit belongs to a second demodulated data symbol in the sequence of demodulated data symbols that immediately follows the first demodulated data symbol in the sequence of demodulated data symbols.

6. The Bluetooth receiver according to claim 5, wherein
the physical layer processing circuitry is further configured to determine a bit among the bits belonging to the second demodulated data symbol with the highest likelihood for being weak-bits based on a least significant bit and a most significant bit among the bits belonging to the second demodulated data symbol.

7. The Bluetooth receiver according to claim 5, wherein the physical layer processing circuitry is further configured to apply a bitwise exclusive or operation on bits belonging to the first demodulated data symbol to determine a bit with the highest likelihood of being weak-bits in the sequential symbol.

8. The Bluetooth receiver according to claim 1, wherein if the bit stream fails its cyclic redundancy check and the modified bit stream passes its cyclic redundancy check, the medium access control layer processing circuitry is further configured to further process only the modified bit stream among the bit stream and the modified bit stream.

9. The Bluetooth receiver according to claim 1, wherein if the bit stream and the modified bit stream fails its cyclic redundancy check, the medium access control layer processing circuitry is further configured to perform the following iterative processing in i-th iterations with $1<i$, wherein i is a number of weak-bit permutations with one flip of a weak-bit at a time:
flip one weak-bit of the identified weak-bits and a sequential bit to the one weak-bit in a bit stream of the (i-1)-th iteration in order to generate a bit stream of the i-th iteration with an unused permutation of weak-bits, wherein the modified bit stream is used as the bit stream of the (i-1)-th iteration for the first iteration;
run the cyclic redundancy check on the bit stream of the i-th iteration; and
determine whether one of the following stop conditions is fulfilled: a) the bit stream of the i-th iteration passes the cyclic redundancy check or b) all permutations of weak-bit are used to generate a bit stream of the (i)-th iteration; and
stop the iterative processing if one of the stop conditions is fulfilled.

10. The Bluetooth receiver according to claim 9, wherein the medium access control layer processing circuitry is further configured to further process only the modified bit stream of the i-th iteration among the bit stream and the modified bit streams if stop condition a) is fulfilled.

11. The Bluetooth receiver according to claim 9, wherein the medium access control layer processing circuitry is further configured to reject the bit stream if stop condition b) is fulfilled.

12. The Bluetooth receiver according to claim 1, wherein if the bit stream and the modified bit stream pass the respective cyclic redundancy check, the medium access control layer processing circuitry is further configured to reject the bit stream.

13. The Bluetooth receiver according to claim 1, wherein if the bit stream passes its cyclic redundancy check and the modified bit stream fails its cyclic redundancy check, the medium access control layer processing circuitry is further configured to perform the following iterative processing in i-th iterations with $1<i$, wherein i is a number of weak-bit permutation with one flip of a weak-bit at a time:
flip one weak-bit of the identified weak-bits and a sequential bit to the one weak-bit in a bit stream of the (i-1)-th iteration in order to generate a bit stream of the i-th iteration with an unused permutation of weak-bits, wherein the modified bit stream is used as the bit stream of the (i-1)-th iteration for the first iteration;
run the cyclic redundancy check on the bit stream of the i-th iteration; and
determine whether one of the following stop conditions is fulfilled: a) the bit stream of the i-th iteration passes the cyclic redundancy check or b) all permutations of weak-bit are used to generate a bit stream of the (i)-th iteration; and
stop the iterative processing if one of the stop conditions is fulfilled.

14. The Bluetooth receiver according to claim 13, wherein the medium access control layer processing circuitry is further configured to reject the bit stream if stop condition a) is fulfilled.

15. The Bluetooth receiver according to claim 13, wherein the medium access control layer processing circuitry is further configured to further process only the modified bit stream of the i-th iteration among the bit stream and the modified bit streams if stop condition b) is fulfilled.

16. The Bluetooth receiver according to claim 1, wherein the medium access control layer processing circuitry is further configured to:
generate a lookup table with syndromes for the bit stream in order to syndrome decode the bit stream; and run the cyclic redundancy check on the bit stream by running the cyclic redundancy check on the syndromes.

17. An electronic device comprising a Bluetooth receiver according to claim 1.

18. A method for a Bluetooth receiver, comprising:
receiving a receive packet by physical layer processing circuitry;
demodulating, by the physical layer processing circuitry, the receive packet into a bit stream representing a sequence of data symbols;
identifying, by the physical layer processing circuitry, a number of bits in the bit stream having a highest likelihood of being weak-bits as weak-bits;
determining, by the physical layer processing circuitry, locations of the identified weak-bits in the bit stream;
transmitting the bit stream and information about the determined locations of the identified weak-bits from the physical layer processing circuitry to a medium access layer processing circuitry;
flipping, by the medium access layer processing circuitry, a first bit of the identified weak-bits and a sequential bit to the first bit in the bit stream in order to generate a modified bit stream;
running, by the medium access layer processing circuitry, a respective cyclic redundancy check on the bit stream and on the modified bit stream; and
comparing, by the medium access layer processing circuitry, results of the cyclic redundancy check on the bit stream and on the modified bit stream.

19. The method according to claim 18, further comprising:
receiving a receive packet;
demodulating the receive packet into a bit stream representing a sequence of data symbols;
generating syndromes for each bit of the bit stream;
mapping the syndromes to a plurality of error groups with different hamming weight, wherein an error pattern of a predefined syndrome is assigned to each syndrome of an error group of the plurality of error groups; and
decoding the bit stream by syndrome decoding, wherein the syndrome decoding differs be-tween the error groups with different hamming weight.

20. A non-transitory, computer-readable medium comprising a program code that, when the program code is executed on a computer, a processor, or a programmable hardware component, performs the method of claim 18.

* * * * *